(12) United States Patent
Cho et al.

(10) Patent No.: US 10,692,801 B2
(45) Date of Patent: Jun. 23, 2020

(54) BOND PAD AND CLIP CONFIGURATION FOR PACKAGED SEMICONDUCTOR DEVICE

(71) Applicant: Infineon Technologies Austria AG, Villach (AT)

(72) Inventors: Eung San Cho, Torrance, CA (US); Chuan Cheah, Torrance, CA (US); Jobelito Anjao Guanzon, Batangas (PH)

(73) Assignee: Infineon Technologies Austria AG, Villach (AT)

( * ) Notice: Subject to any disclaimer, the term of this patent is extended or adjusted under 35 U.S.C. 154(b) by 22 days.

(21) Appl. No.: 15/994,306

(22) Filed: May 31, 2018

(65) Prior Publication Data

US 2019/0371711 A1    Dec. 5, 2019

(51) Int. Cl.
*H01L 23/495* (2006.01)
*H01L 23/00* (2006.01)
*H01L 23/31* (2006.01)
*H01L 21/56* (2006.01)

(52) U.S. Cl.
CPC ........ *H01L 23/49513* (2013.01); *H01L 21/56* (2013.01); *H01L 23/3121* (2013.01); *H01L 23/562* (2013.01); *H01L 23/564* (2013.01); *H01L 24/09* (2013.01); *H01L 24/41* (2013.01)

(58) Field of Classification Search
CPC ........ H01L 24/40; H01L 24/37; H01L 24/48; H01L 24/32; H01L 23/49575; H01L 23/49513
See application file for complete search history.

(56) References Cited

U.S. PATENT DOCUMENTS

| 7,417,257 | B2 | 8/2008 | Beach et al. |
| 7,994,632 | B2 | 8/2011 | Hu et al. |
| 9,048,196 | B2 | 6/2015 | Standing et al. |
| 9,048,838 | B2 | 6/2015 | Otremba et al. |
| 9,607,940 | B2 * | 3/2017 | Yato ...................... H01L 23/562 |
| 2015/0041984 | A1 * | 2/2015 | Otremba ........... H01L 23/49524 257/773 |
| 2015/0115313 | A1 * | 4/2015 | Otremba ........... H01L 23/49524 257/124 |
| 2017/0207306 | A1 * | 7/2017 | Otremba ............. H01L 29/1608 |

* cited by examiner

*Primary Examiner* — Zandra V Smith
*Assistant Examiner* — John M Parker
(74) *Attorney, Agent, or Firm* — Murphy, Bilak & Homiller, PLLC

(57) ABSTRACT

A semiconductor device package includes a die pad having a die attach surface, a first lead that is spaced apart and extends away from a first side of the die pad, and a semiconductor die mounted on the die attach surface. The semiconductor die includes a first bond pad disposed on an upper side of the semiconductor die that is opposite the die attach surface. A first clip electrically connects the first lead to the first bond pad. The first bond pad is elongated with first and second longer edge sides that are opposite one another and extend along a length of the first bond pad. The semiconductor die is oriented such that the first and second longer edge sides of the first bond pad are non-parallel to a first current flow direction of the first clip that extends between the first bond pad and the first lead.

22 Claims, 5 Drawing Sheets

BOND PAD AND CLIP CONFIGURATION FOR PACKAGED SEMICONDUCTOR DEVICE

The present invention generally relates to semiconductor device packaging and more particularly relates to bonding configurations between semiconductor dies and conductive clips in semiconductor device packages.

BACKGROUND

Semiconductor packages are commonly used to house and protect integrated circuits, such as microprocessors, power transistors, amplifiers, controllers, ASIC devices, sensors, etc. A common configuration of a semiconductor package includes a metal substrate, i.e., a "die pad," that is centrally located within the package, and a plurality of electrically conductive leads that are spaced apart and extend away from the substrate. A semiconductor die (or dies) is mounted on the substrate by solder or adhesive, for example. The semiconductor die includes conductive bond pads on its upper surface. These conductive bond pads provide the input output terminals of the semiconductor die. An electrical connection is provided between the bond pads and the package leads. An encapsulant material seals and protects the semiconductor die and the electrical connections from moisture and dust particles. The ends of the leads are exposed from the encapsulant material and thus provide externally accessible terminals for the packaged device.

There are several techniques for electrically connecting the bond pads of the semiconductor die to the package leads in semiconductor packages. For example, one common technique is a wire bonding technique wherein one or more bond wires are bonded to each bond pad and to the package leads. One drawback of a wire bonding technique is that the wire bonding process may damage the bond pads. Another drawback of a wire bonding technique is that minor variations in wire bond loop height and length, which are difficult to control, can cause significant variation in the electrical behavior (e.g., inductance) of the electrical connection. For these reasons, metal clips have gained favor over bond wires in certain applications. Metal clips are typically metal structures that are specially designed for placement on the bond pad and leads so as to provide an electrical connection between the two. Metal clips offer improved electrical performance (e.g., lower resistance, better current distribution, etc.), as they are substantially wider and thicker than typical bond wires.

Designers are constantly seeking ways to improve the performance of packaged semiconductor devices. In particular, designers are seeking to improve the electrical performance and reliability of the electrical connections between the semiconductor die and package leads.

SUMMARY

A semiconductor device package is disclosed. According to an embodiment, the semiconductor device package includes a die pad having a die attach surface, a first lead that is spaced apart and extends away from a first side of the die pad, and a semiconductor die mounted on the die attach surface. The semiconductor die includes a first bond pad disposed on an upper side of the semiconductor die that is opposite the die attach surface. The semiconductor device package further includes a first clip that electrically connects the first lead to the first bond pad. The first bond pad is elongated with first and second longer edge sides that are opposite one another and extend along a length of the first bond pad. The semiconductor die is oriented such that the first and second longer edge sides of the first bond pad are non-parallel to a first current flow direction of the first clip. The first current flow direction extends between the first bond pad and the first lead.

According to another embodiment, the semiconductor device package includes a die pad having a die attach surface, a first lead that is spaced apart and extends away from a first side of the die pad, a second lead that is spaced apart and extends away from a second side of the die pad that is opposite the first side, and a semiconductor die mounted on the die attach surface. The semiconductor die includes a first terminal that is provided by first and second bond pads, and a second terminal that is provided by third and fourth bond pads. The semiconductor device package further includes a first clip that electrically connects the first lead to the first and second bond pads and a second clip that electrically connects the second lead to the third and fourth bond pads. The first, second, third and fourth bond pads are parallel to and spaced apart from one another. The third bond pad is disposed between the first and second bond pads. The second bond pad is disposed between the third and fourth bond pads. The first bond pad is spaced closest to the first side of the die pad. The fourth bond pad is spaced closest to the second side of the die pad.

A method of packaging a semiconductor device is disclosed. According to an embodiment, the method includes providing a die pad having a die attach surface, providing a first lead that is spaced apart and extends away from a first side of the die pad, providing a semiconductor die having an electrically conductive first bond pad disposed on an upper side of the semiconductor die that is opposite the die attach surface, providing a first clip, mounting the semiconductor die on the die attach surface, and electrically connecting the first bond pad to the first lead using the first clip. The first bond pad is elongated with first and second longer edge sides that are opposite one another and extend along a length of the first bond pad. The semiconductor die is oriented such that the first and second longer edge sides of the first bond pad are non-perpendicular to a first current flow direction of the first clip, the first current flow direction extending between the first bond pad and the first lead.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a packaged semiconductor device with metal clips connecting bond pads from a semiconductor die to package leads are described herein. The bond pads are elongated in a different direction as the current flow of the clips to which they are connected to. Put another way, the bond pads are oriented so that the longer edge sides of the bond pads extend at least partially in a width direction of the clips. According to one embodiment, the bond pads are oriented so that the longer edge sides of the bond pads are perpendicular to the current flow direction in the clips. Thus, the length of the bond pads extends across the width of the clips. As will be explained in further detail below, one advantage of this arrangement is a reduction in effective length of the current path between the bond pads and leads, and consequently a reduction in effective resistance, in comparison to other designs.

Figure 1:
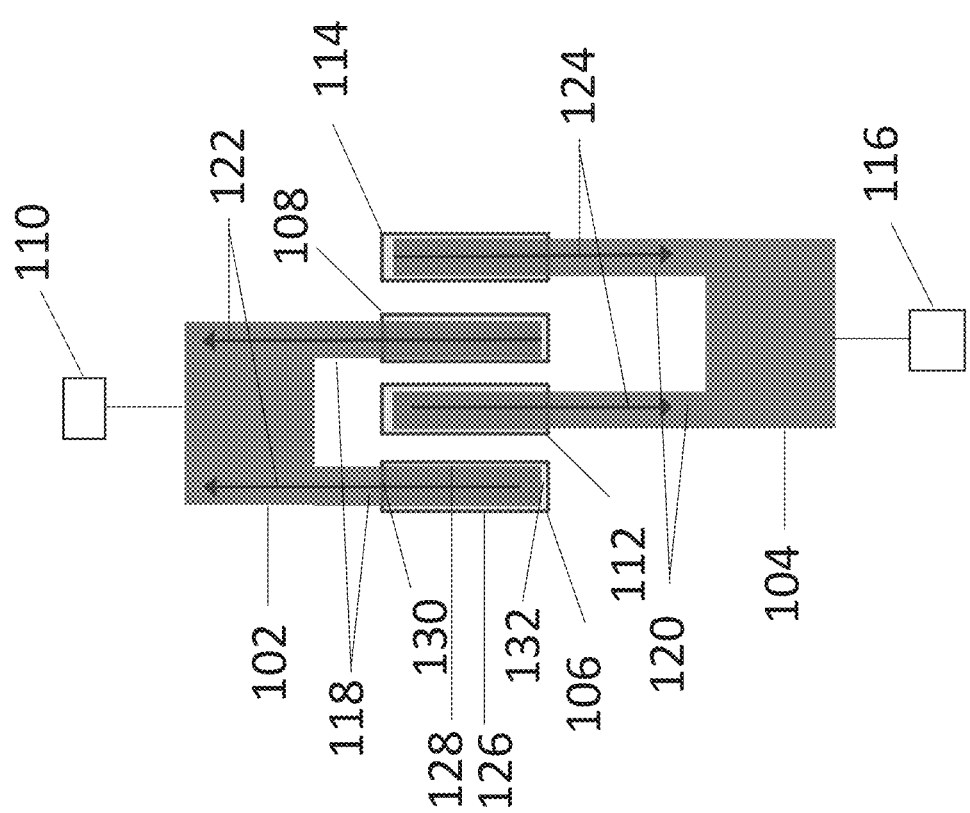
FIG. 1 depicts a clip and bond pad configuration in which the elongation of the bond pads is parallel with the current flow direction of the clips, according to an embodiment.

Referring to FIG. 1, one example of a clip and bond pad configuration is illustrated. This clip and bond pad configuration will be referred to as a "parallel finger" configuration in the following description. In the figure, end portions of first and second clips 102, 104 are depicted. The first clip 102 electrically connects first and second bond pads 106, 108 to a first external package lead 110, which is schematically represented in the figure. The second clip 104 electrically connects third and fourth bond pads 112, 114 to a second external package lead 116, which is schematically represented in the figure.

The end portion of the first lead 102 includes two elongated fingers 118 that are parallel to and spaced apart from one another. The end portion of the second lead 104 also includes two elongated fingers 120 that are parallel to and spaced apart from one another. Each of the elongated fingers 118, 120 make electrical contact with one of the bond pads.

In the parallel finger configuration of FIG. 1, each of the bond pads are elongated in a direction that is parallel to the current flow direction. The current flow direction refers to the direction that current travels in the clips as it enters or exits the bond pads. As shown, current leaving the first and second bond pads 106, 108 travels along a first current flow direction 122 to reach the first lead 110. Similarly, current leaving the third and fourth bond pads 112, 114 travels along a second current flow direction 124 to reach the second lead 116. Each of the bond pads include first and second longer edge sides 126, 128 that extend in a length direction of the bond pad, and third and fourth shorter edge sides 130, 132 that extend a width direction of the bond pad. For the sake of simplicity, these features are identified only on the first bond pad 106 in the figure.

In the parallel finger configuration, the first and second longer edge sides 126, 128 of the first clip 102 are oriented parallel to the first current flow direction 122. The end portion of the first clip 102 is designed so that the elongated fingers 118 of the first clip 102 can be placed over the first and second bond pads 106, 108 with the outer edge sides of the elongated fingers 118 being parallel to the first and second longer edge sides 126, 128 of the first bond pad 106. The elongated fingers 120 of the second clip 104 are configured in a corresponding fashion with respect to the first and second longer edge sides 126, 128 of the third and fourth bond pads 112, 114.

Figure 2:
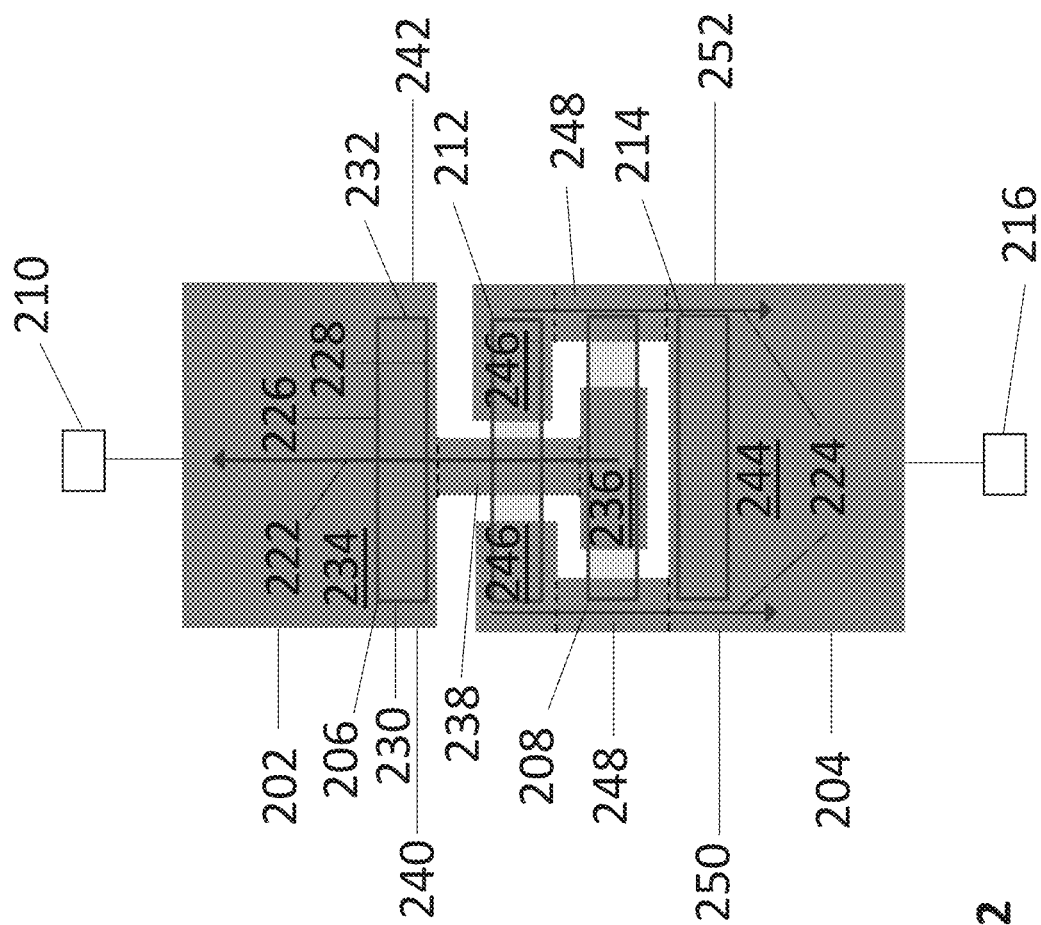
FIG. 2 depicts a clip and bond pad configuration in which the elongation of the bond pads is non-parallel with the current flow direction of the clips, according to an embodiment.

Referring to FIG. 2, one embodiment of a clip and bond pad configuration that offers several notable advantages over the parallel finger configuration of FIG. 1 is depicted. As will be explained in further detail below, this configuration differs from the parallel finger configuration in that the bond pads have been rotated relative to the respective current flow directions and the end portions of the first and second clips have been reconfigured to accommodate this rotation.

In the embodiment of FIG. 2, end portions of first and second clips 202, 204 are depicted. The first clip 202 electrically connects first and second bond pads 206, 208 to a first external package lead 210, which is schematically represented in the figure. The second clip 204 electrically connects third and fourth bond pads 212, 214 to a second external package lead 216, which is schematically represented in the figure. The first and second bond pads 206, 208 can provide one device terminal (e.g., a drain terminal) while the third and fourth bond pads 212, 214 can provide another device terminal (e.g., a source terminal). The bond pads are arranged in an alternating, interdigitated fashion, meaning that the third bond 212 pad is disposed between the first and second bond pads 206, 208, and the second bond pad 208 is disposed between the third and fourth bond pads 212, 214.

Each of the first, second, third and fourth bond pads 206, 208, 212, 214 are elongated. This means that a length of each of the first, second, third and fourth bond pads 206, 208, 212, 214 exceeds its width. Each of the first, second, third and fourth bond pads 206, 208, 212, 214 include first and second longer edge sides 226, 228 that extend in a length direction of the bond pad, and third and fourth shorter edge sides 230, 232 that extend a width direction of the bond pad. For the sake of simplicity, these features are identified only on the first bond pad 206 in the figure.

In the depicted example, the first, second, third and fourth bond pads 206, 208, 212, 214 are each configured as elongated rectangles. This means that each of the first, second, third and fourth bond pads 206, 208, 212, 214 include two of the first and second longer edge sides 226, 228 that are linear and parallel to one another, and two of the shorter edge sides 230, 232 extending between and running perpendicular to the respective first and second longer edge sides 226, 228. More generally, the first, second, third and fourth bond pads 206, 208, 212, 214 can have the geometry of any enclosed loop with a length that exceeds its width.

In the depicted example, the first, second, third and fourth bond pads 206, 208, 212, 214 are each parallel to one another. This means that central axes of the first, second, third and fourth bond pads 206, 208, 212, 214 extending along the length direction of these bond pads are parallel to one another. More generally, at least one of these bond pads can extend along a different direction as the other bond pads.

One difference between the parallel finger configuration described with reference to FIG. 1 and the clip and bond pad configuration of FIG. 2 is that the bond pads have been rotated relative to the current flow direction. The current flow direction refers to the direction that current travels in the clips as it enters or exits the bond pads. As shown, current leaving the first and second bond pads 206, 208 travels along a first current flow direction 222 to reach the first lead 210. Similarly, current leaving the third and fourth bond pads 212, 214 travels along a second current flow direction 224 to reach the second lead 216. Whereas the bond pads extend lengthwise in the same direction as the current flow direction in the parallel finger configuration, the bond pads are oriented to extend non-parallel to the current flow direction in the embodiment of FIG. 2.

In the depicted example, the first and second bond pads 206, 208 are oriented so that the first and second longer edge sides 226, 228 of these bond pads are perpendicular to the first current flow direction 222. Likewise, the third and fourth bond pads 212, 214 are oriented so that the first and second longer edge sides 226, 228 of these bond pads are perpendicular to the second current flow direction 224. Put another way, the elongation direction of the first, second, third and fourth bond pads 206, 208, 212, 214 runs perpendicular to the direction of current flowing through the respective leads to which these bond pads are connected to.

More generally, the first, second, third and fourth bond pads 206, 208, 212, 214 can be oriented such that the longer edge sides are oriented at a non-parallel angle (e.g., 15 degrees, 30 degrees, 45 degrees, 60 degrees, etc.) relative to the first or second current flow directions 222, 224 as the case may be.

Another difference between the parallel finger configuration described with reference to FIG. 1 and the clip and bond pad configuration of FIG. 2 is that the geometry of the end portions of the first and second clips 202, 204 has been reconfigured in view of the rotation of the bond pads. The first clip 202 of FIG. 2 includes a single continuous piece that extends in the first current flow direction 222 and makes direct electrical contact with the first and second bond pads 206, 208. The second clip 204 is configured as a two-pronged structure that fits around the continuous piece of the first clip 202 and makes direct electrical contact with the third and fourth bond pads 212, 214.

The end portion of the first clip 202 includes a first section 234, a second section 236, and a third section 238. The first section 234 covers the first bond pad 206. This means that the first section 234 is disposed directly over and at least partially overlaps with the first bond pad 206. In addition, the first section 234 electrically contacts the first bond pad 206. This can be achieved by direct physical contact between the two elements, or by a conductive connection medium, e.g., solder, sinter, conductive paste, etc. The second section 236 is spaced apart from the first section 234 in the first current flow direction 222. The second section 236 covers and electrically contacts the second bond pad 208 in a corresponding manner. The third section 238 extends between the first and second sections 234, 236 in the first current flow direction 222.

According to an embodiment, the width of the first section 234 is equal to or greater than the length of the first bond pad 206. In this way, the first clip 202 can be placed over the first bond pad 206 with the first section 234 completely covering the first bond pad 206 and the first bond pad 206 extending lengthwise across a width of the first section 234 e.g., as depicted. The width of the first section 234 refers to a minimum distance between first and second outer edge sides 240, 242 of the first clip 202 in the first section 234 that extends in a length direction of the first clip 202. The length of the first bond pad 206 refers to a minimum distance between the third and fourth shorter edge sides 230, 232 of the first bond pad 206. The width of the first bond pad 206 refers to a minimum distance between the first and second longer edge sides 226, 228 of the first bond pad 206.

According to an embodiment, the width of the second section 236 is less than the width of the first section 234. Moreover, as depicted, the width of the second section 236 can be less than the length of the second bond pad 208. In this way, the first clip 202 can be placed over the first bond pad 206 with the second section 236 partially covering the second bond pad 208 in a central region with end portions of the second bond pad 208 exposed from the second section 236, e.g., as depicted. The width of the second section 236 refers to a minimum distance between the first and second outer edge sides 240, 242 of the first clip 202 in the second section 236 that are opposite one another and extend in a length direction of the first clip 202. The length of the second bond pad 208 refers to a minimum distance between the first and second shorter edge sides 230, 232 of the second bond pad 208. The width of the second bond pad 208 refers to a minimum distance between the longer edge sides of the second bond pad 208.

According to an embodiment, the width of the third section 238 is less than the width of the first and second sections 234, 236. The width of the third section 238 refers to a minimum distance between first and second outer edge sides 240, 242 of the first clip 202 in the third section 238 that are opposite one another and extend in a length direction of the first clip 202.

The end portion of the second clip 204 includes a fifth section 244, two sixth sections, and two seventh sections. The fifth section 244 covers and makes direct electrical contact with the fourth bond pad 214 in a similar manner as described above with respect to the first section 234 and the first bond pad 206. The sixth sections 246 are spaced apart from the fifth section 244 in the second current flow direction 224. The sixth sections 246 cover and electrically contact end portions of the third bond pad 212 in a corresponding manner. The seventh sections 248 extend between the fifth and sixth sections 244, 246 in the second current flow direction 224.

According to an embodiment, the width of the fifth section 244 is equal to or greater than the length of the fourth bond pad 214. In this way, the second clip 204 can be placed over the fourth bond pad 214 with the fifth section 244 completely covering the fourth bond pad 214, e.g., as depicted. The width of the fifth section 244 refers to a minimum distance between first and second outer edge sides 250, 252 of the second clip 204 that extend in a length direction of the second clip 204. The length of the fourth bond pad 214 refers to a minimum distance between the first and second shorter edge sides 230, 232 of the fourth bond pad 214. The width of the fourth bond pad 214 refers to a minimum distance between the first and second longer edge sides 226, 228 of the fourth bond pad 214.

The end portion of the second clip 204 is configured such that the sixth sections 246 partially cover the fourth bond pad 214. More particularly, the sixth sections 246 cover outer portions of fourth bond pad 214. The electrical connection between the second clip 204 and the fourth bond pad 214 occurs at these outer, covered portions of the fourth bond pad 214. Between the sixth sections 246, a gap is provided. The third section 238 of the first clip 202 extends through this gap between the two sixth sections 246. The seventh sections 248 of the second clip 204 are also spaced apart from one another. The second section 236 of the first clip 202 is disposed between the two of the seventh sections 248. This configuration allows the first and second clips 202, 204 to mate with one another in a way that makes electrical contact to each of the interdigitated bond pads possible.

In comparison to the parallel finger configuration previously described with reference to FIG. 1, the clip and bond pad configuration of FIG. 2 advantageously reduces the effective length of the current path between the bond pads and the lead to which they are connected. By rotating the interdigitated bond pads as illustrated, the first and second bond pads 206, 208 are collectively located closer to the first lead 210, and the third and fourth bond pads 212, 214 are collectively located closer to the second lead 216. As can be seen in in the parallel finger configuration of FIG. 1, each of the parallel fingers 118, 120 extends along a complete length of the bond pad array. By contrast, in the configuration of FIG. 2, the first clip 202 only extends across three bond pads of the four (i.e., the first, second and third bond pads 206, 208, 212), while the second clip 204 only extends across three different bond pads of the four (e., the fourth, third and second bond pads 214, 212, 208). Thus, the overall length of the first and second clips 202, 204 can be reduced, and a favorable reduction in resistance is achieved.

Figure 3:
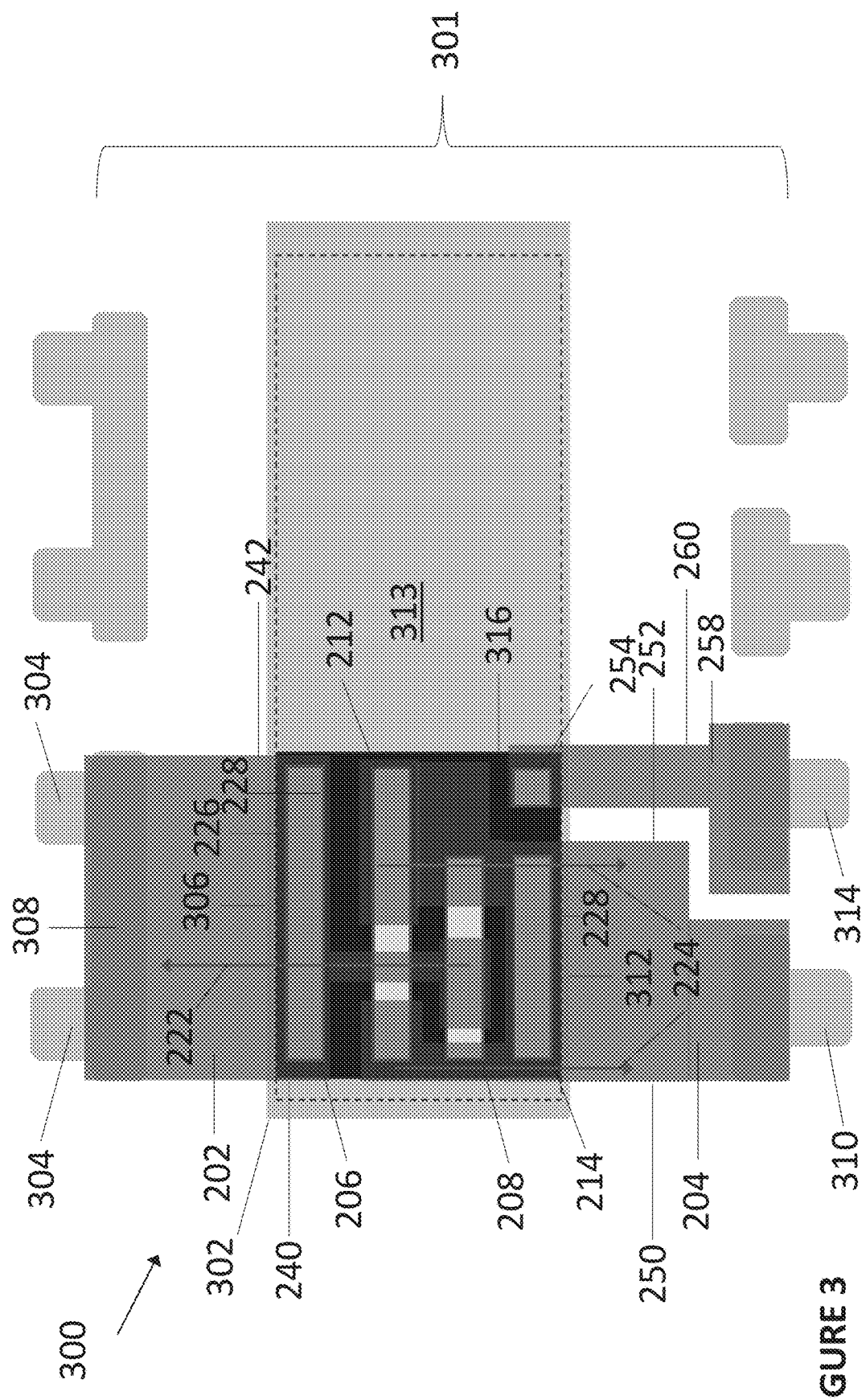
FIG. 3 depicts a lead frame and die assembly having a clip and bond pad configuration in which the elongation of the bond pads is non-parallel with the current flow direction of the clips, according to an embodiment.

Referring to FIG. 3, a lead frame assembly 300 that utilizes the clip and bond pad configuration described with reference to FIG. 2 is depicted, according to an embodiment. The lead frame assembly includes a lead frame 301. The lead frame 301 can be part of a lead frame strip that includes a plurality of identically configured lead frames 300 so that a plurality of the semiconductor device packages can be formed in parallel. The lead frame 301 can be formed from a layer of sheet metal, and the features depicted and described herein can be formed using conventional techniques such as stamping and punching. Exemplary materials for the lead frame 301 include metals such as copper, aluminum, nickel, iron, zinc, etc., and alloys thereof.

The lead frame 301 includes a centrally located die pad 302. The die pad 302 can be an electrically conductive and/or thermally conductive structure. The die pad 302 includes a die attach surface 313 and an outer surface 315 (shown in FIG. 4) that is opposite the die attach surface 313. The die attach surface 313 and the outer surface 315 may be substantially planar. That is, each of these surfaces can extend along a single plane.

The lead frame 301 additionally includes a number of electrically conductive leads that are spaced apart from and extend away from the die pad 302. More particularly, first leads 304 are spaced apart from and extend away from a first side 306 of the die pad 302. In the depicted example, two of the first leads 304 are connected together by a lateral pad 308. A second lead 310 is spaced apart from and extends away from a second side 312 of the die pad 302 that is opposite the first side 306. A third lead 314 is spaced apart from and extends away from the second side 312 of the die pad 302 as well. This third lead 314 is separated from and electrically disconnected from the second lead 310. Thus, the pair of first leads 304 provides a first package level terminal, the second lead 310 provides a second package level terminal, and the third lead 314 provides a third package level terminal.

A semiconductor die 316 is mounted on the die attach surface 313 of the die pad 302. The semiconductor die 316 can be configured as any of a wide variety of devices. Examples of these devices include transistors, such as MOS-FETs (metal-oxide semiconductor field-effect transistor), LIMOS (laterally-diffused metal-oxide semiconductor) devices, and HEMT (high electron mobility transistor) devices, etc. More generally, the semiconductor die 316 can be any kind of integrated circuit or discrete device. The semiconductor die 316 can be mounted to the die pad 313 with an adhesive provided between the lower side of the semiconductor die 316 (not shown) and the die attach surface 313. Suitable adhesives include solder, sinter, adhesive tape, glue, etc.

The semiconductor die 316 includes a number of electrically conductive bond pads disposed on an upper side of the semiconductor die 316 that is opposite the die attach surface 313. In particular, the semiconductor die 316 includes first, second, third and fourth bond pad 206, 208, 212, 214. The first, second, third and fourth bond pad 206, 208, 212, 214 are each elongated in a similar manner as previously described with reference to FIG. 2. Moreover, the first, second, third and fourth bond pads 206, 208, 212, 214 are parallel to and spaced apart from one another in a similar manner as previously described with reference to FIG. 2. Different to the previously described bond pad configuration, a fifth bond pad 254 is included in the set of bond pads, and the second and fourth bond pads 208, 214 are shorter than the first and third bond pads 206, 212. The bond pads provide different input/output terminals of the semiconductor die 316. In particular, the first and second bond pads 206, 208 collectively provide a first terminal, the third and fourth bond pads 212, 214 collectively provide a second terminal, and the fifth bond pad 254 provides a third terminal of the semiconductor die 316. If, for example, the semiconductor die 316 is configured as a transistor, the first terminal can be a drain terminal of the device, the second terminal can be a source terminal of the device, and the third terminal can be a gate terminal. Of course, this is one example. More generally, the semiconductor die 316 can include any of a wide variety of bond pad configurations for different terminals.

A first clip 202 electrically connects the first terminal of the semiconductor die 316, which is provided by the first and second bond pads 206, 208, to the first leads 304. A second clip 204 electrically connects the second terminal of the semiconductor die 316, which is provided by the third and fourth bond pad 212, 214, to the second lead 310. A third clip 258 electrically connects the third terminal of the semiconductor die 316, which is provided by the fifth bond pad 254, to the third lead 314.

In the lead frame assembly 300 of FIG. 3, the semiconductor die 316 has been oriented on the die pad 302 so that the first bond pad 206 is spaced closest to the first side 306 of the die pad 302. This means that the shortest distance possible between an edge side of the first bond pad 206 and the first side 306 of the die pad 302 is less than the shortest distance possible between any edge sides from the second, third, and fourth bond pads 208, 212, 214 and the first side 306 of the die pad 302. In the depicted example, the first longer edge side 226 of the first bond pad 206 faces and is spaced closer to the first side 306 of the die pad 302 than any of the first and second longer edge sides 226, 228 of the second, third and fourth bond pads 208, 212, 214. Moreover, in the depicted embodiment, the first longer edge side 226 of the first bond pad 206 is parallel to the first side 306 of the die pad 302. Similarly, the semiconductor die 316 is oriented so that the fourth bond pad 214 is spaced closest to the second side 312 of the die pad 302. This means that the shortest distance possible between an edge side of the second bond pad 208 and the second side 312 of the die pad 302 is less than the shortest distance possible between any edge sides from the first, second, and third bond pads 206, 208, 214 and the fourth side of the die pad 302. Moreover, in the depicted embodiment, the second longer edge side 228 of the fourth bond pad 214 is parallel to the second side 312 of the die pad 302.

By orienting the semiconductor die 316 so that the first bond pad 206 is spaced closest to the first side 306 of the die pad 302 and so that the fourth bond pad 214 is spaced closest to the second side 312 of the die pad 302, the favorable reduction in clip length as described above can be achieved.

In the lead frame assembly 300 of FIG. 3, the semiconductor die 316 has been oriented relative to the die pad 302 and clips so that the longer edge sides of the bond pads are non-parallel to the current flow direction, e.g., as described with reference to FIG. 2. In this lead frame assembly 300, the first current flow direction 222 extends between the first bond pad 206 and the first leads 304, and the second current flow direction 224 extends between the fourth bond pad 214 and the second leads 310.

The features of the die pad 302 can provide a reference point for orienting the semiconductor die 316 such that the bond pads extend non-parallel to the current flow direction. In the depicted embodiment, the first current flow direction 222 is perpendicular to the first side 306 of the die pad 302. This is because the first clip 202 extends between the first bond pad 206 and the first leads 304 in a direction that is perpendicular to the first side 306 of the die pad 302, and thus current flows from the first bond pad 206 to the first leads 304 in a direction that is perpendicular to the first side 306 of the die pad 302. Thus, by mounting the semiconductor die 316 such that the bond pads are non-perpendicular to the first side 306 of the die pad 302, the previously discussed non-parallel orientation of the bond pads can be achieved. For example, in the depicted embodiment, the semiconductor die 316 is mounted such that the first and second longer edge sides 226, 228 of the first bond pad 206 are parallel to the first side 306 of the die pad 302. Thus, the first and second longer edge sides 226, 228 of the first bond pad 206 are perpendicular to the first current flow direction 222. The same principles can be used to orient the fourth bond pad 214 relative to the second current flow direction 224 using the second side 228 of the die pad 302. Of course, in a package design in which the clip is angled relative to the side of the die pad to which it extends over, the same result would not be achieved. However, in that case, provided that the angle between the extension of the clip and the edge side of the die pad is known, similar principles can be used to orient the semiconductor die so that the bond pads are non-parallel to the current flow direction.

In addition or in the alternative, the features of the clips can provide a reference point for orienting the semiconductor die 316 such that the bond pads extend non-parallel to the current flow direction. In particular, the first and second outer edge sides 240, 242 of the first clip 202 can provide a reference point for orienting the semiconductor die 316. These first and second outer edge sides 240, 242 are opposite one another and intersect with the first side 306 of the die pad 302. In the case of a rectangularly shaped first clip 202 (e.g., as depicted), the first current flow direction 222 is parallel to the first and second outer edge sides 240, 242. Thus, the semiconductor die 316 can be oriented so that the first and second longer edge sides 226, 228 of the first bond pad 206 are non-parallel to the first and second outer edge sides 240, 242 of the first clip 202. For example, in the depicted embodiment, the first and second longer edge sides 226, 228 of the first bond pad 206 are oriented perpendicular to the first and second outer edge sides 240, 242 and are thus perpendicular to the first current flow direction 222. The same principles can be used to orient the fourth bond pad 214 relative to the second current flow direction 224 using the first and second outer edge sides 250, 252 of the second clip 204. Of course, in a clip design which the clip includes tapered or non-parallel edge sides, the same result would not be achieved. However, in that case, provided that the relationship between the angle of the edge side to the overall direction of extension of the clip is known, similar principles can be used to orient the semiconductor die so that the bond pads are non-parallel to the current flow direction.

In the depicted embodiment, the width of the first clip 202, as measured between the first and second outer edge sides 240, 242 is substantially equal to a collective width of the second and third clips 204, 258. The collective width of the second and third clips 204, 258 is measured between a first outer edge side 250 of the second clip 204 that faces away from the third clip 258 and a second outer edge side 260 of the third clip 258 that faces away from the second clip 204. In this way, the lead frame assembly 300 of FIG. 3 provides a compact design whereby all of the necessary electrical connections between the semiconductor die 316 and leads are provided within a defined width that is about the same width as the width of the semiconductor die 316. Moreover, the design only occupies the width of two package leads despite the fact that the semiconductor die 316 includes three different terminals. By way of comparison, other clip and bond pad configurations for semiconductor dies with three terminals typically utilize a bond wire to effectuate the gate connection, and typically require additional lateral space.

Figure 4:
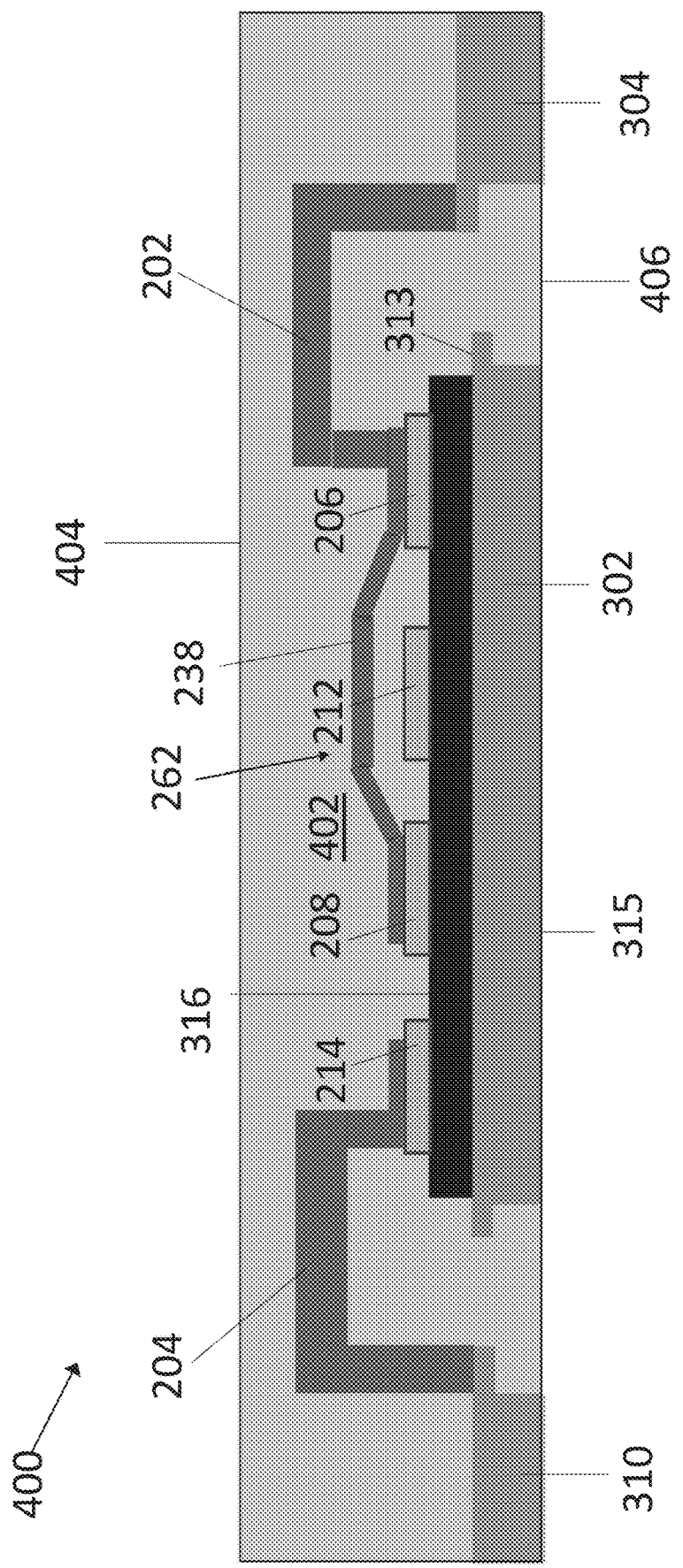
FIG. 4 depicts a semiconductor device package that can be formed from the lead frame and die assembly of FIG. 3, according to an embodiment.

Referring to FIG. 4, an example of a packaged semiconductor device 400 that can be formed from the lead frame assembly 300 of FIG. 3 is depicted, according to an embodiment. The packaged semiconductor device 400 includes an encapsulant body 402 that is formed from an electrically insulating material, e.g., ceramic, plastic, etc. This material can be molded, e.g., by an injection or transfer molding process in one example. The encapsulant body 402 encapsulates the semiconductor die 316, the die pad 302, and the first and second clip 202, 204. That is, encapsulant body 402 completely covers the semiconductor die 316 and the associated electrical connections so as to protect these elements from the exterior environment.

The encapsulant body 402 includes an upper side 404 and a lower side 406 that is opposite the upper side. Both the upper side 404 and the lower side 406 of the encapsulant body 402 may be substantially planar surfaces, for example.

Ends of the first and second leads 304, 310 are exposed from the encapsulant material at the lower side 406 of the encapsulant body 402. In the depicted embodiment, the exposed surfaces of the first and second leads 304, 310 are coplanar with the lower side 406 of the encapsulant body 402. This provides a so-called "surface-mount" package type configuration, wherein the semiconductor device package 400 is configured to be mounted flush against a surface, e.g., a PCB socket. More generally, the packaged semiconductor device 400 can have a wide variety of configurations, including a configuration in which the leads protrude away from the encapsulant. An outer surface 315 of the die pad 302 that is opposite from the die attach surface 313 is exposed at the lower side 406 of the encapsulant body 402 between the exposed ends of the first and second leads 304, 310. Further, the outer surface of the die pad 302 may be coplanar with the lower side 406 of the encapsulant body 402. In this configuration, the die pad 302 can face and contact a heat dissipating mechanism (e.g., a heat sink) in the receptacle to which the semiconductor device package 400 is mounted. In another example (not shown) a thermally conductive coolant material is provided between the semiconductor die 316 and the upper side 404 of the encapsulant body 402. In this configuration, a heat dissipating mechanism (e.g., a heat sink) can be mounted on the upper side 404 of the encapsulant body 402.

In the depicted embodiment, the first and second clips 202, 204 are completely encapsulated by the encapsulant body 402. In another embodiment (not shown) upper portions of the first and second clips 202, 204 may be exposed at the upper side 404 of the encapsulant body.

As shown in FIG. 4, the third section 238 of the first clip 202 can include an elevated bridge 262 that is vertically spaced apart from the third bond pad 212. This elevated bridge 262 provides significant separation distance between the first clip 202 and the third bond pad 212 and provides an area for encapsulant to enter between the two. This configuration increases the electrical isolation between the first and second terminals (e.g., the source and drain terminals) of the device.

Figure 5:
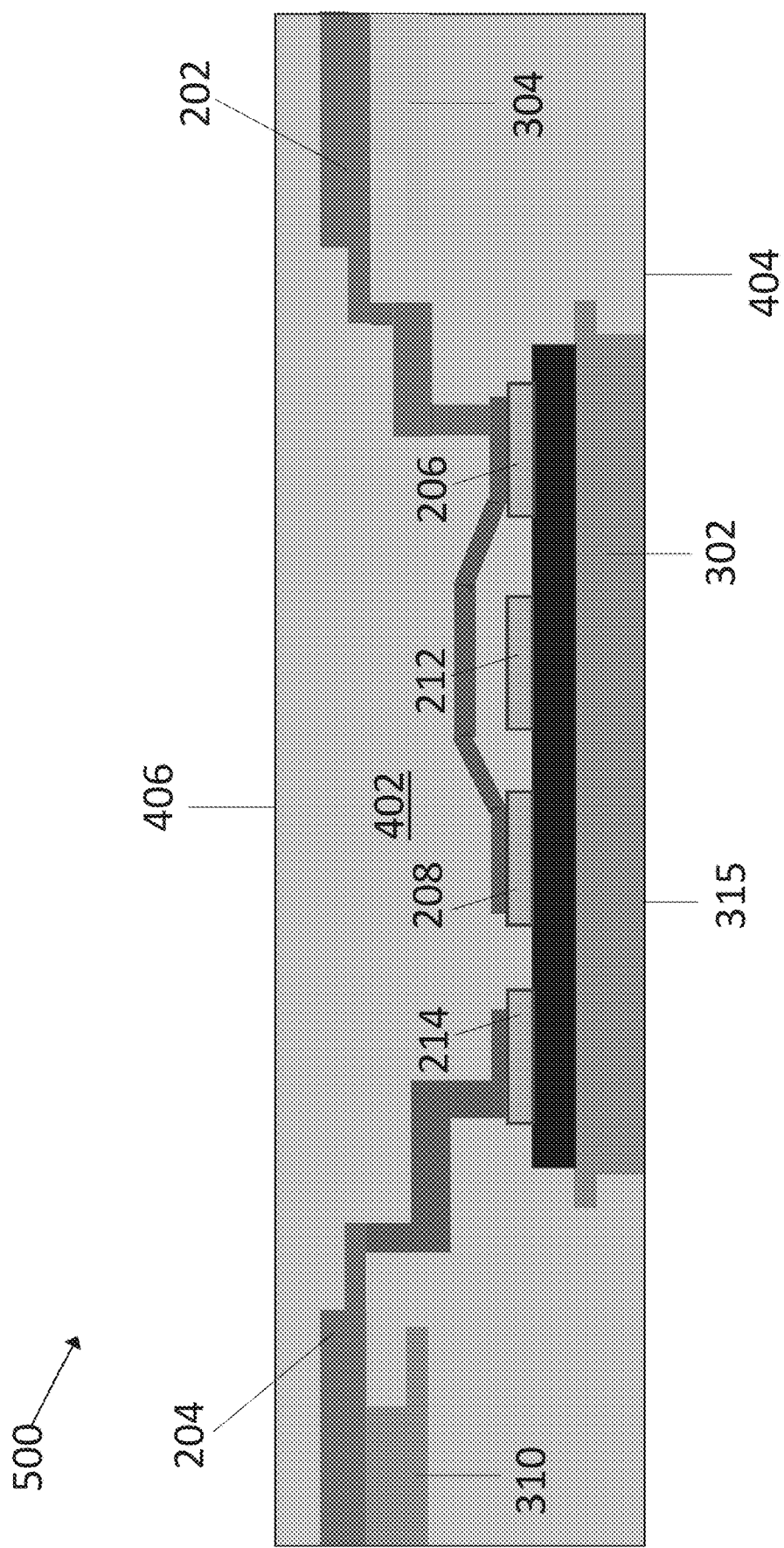
FIG. 5 depicts a semiconductor device package that can be formed from the lead frame and die assembly of FIG. 3, according to another embodiment.

Referring to FIG. 5, an example of a packaged semiconductor device 500 that can be formed from the lead frame assembly 300 of FIG. 3 is depicted, according to an embodiment. The packaged semiconductor device 500 can be substantially similar or identical to that of FIG. 4, except as follows. The vertical arrangement of the die pad 302 is reversed so that the outer surface 315 of the die pad 302 is exposed at the upper side 404 of the encapsulant body 402. Prior to encapsulation, the clips can be attached and electrically connected to the leads, e.g., by soldering. In this configuration, the leads 304, 310 are externally accessible at the sidewalls of the encapsulant body 402 that extend between the upper and lower sides 404, 406 of the encapsulant body 402.

In the depicted embodiment, the first and second clips 202, 204 are completely encapsulated by the encapsulant body 402. In another embodiment (not shown) upper portions of the first and second clips 202, 204 may be exposed at the lower side 406 of the encapsulant body.

The package configuration of FIG. 5 can be mounted on a receptible (e.g., a PCB) with the exposed clips 202, 204 facing and electrically connected to the receptacle, and a heat sink or heat spreader can be mounted on the upper side of the package. This configuration may provide better space efficiency and/or thermal dissipation in comparison to the configuration of FIG. 4 in certain applications.

A semiconductor device package is disclosed herein. According to an embodiment, the semiconductor device package includes a die pad having a die attach surface, a first lead that is spaced apart and extends away from a first side of the die pad, and a semiconductor die mounted on the die attach surface. The semiconductor die includes a first bond pad disposed on an upper side of the semiconductor die that is opposite the die attach surface. The semiconductor device package further includes a first clip that electrically connects the first lead to the first bond pad. The first bond pad is elongated with first and second longer edge sides that are opposite one another and extend along a length of the first bond pad. The semiconductor die is oriented such that the first and second longer edge sides of the first bond pad are non-parallel to a first current flow direction of the first clip. The first current flow direction extends between the first bond pad and the first lead.

In an embodiment that can be combined with others, the first clip includes first and second outer edge sides that are opposite one another and intersect with the first side of the die pad, and the first current flow direction is parallel to the first and second outer edge sides.

In an embodiment that can be combined with others, the first current flow direction is perpendicular to the first side of the die pad.

In an embodiment that can be combined with others, the semiconductor die further includes a second bond pad disposed on the upper side of the semiconductor die, the second bond pad is elongated with first and second longer edge sides that are opposite one another and extend along a length of the second bond pad, the second bond pad is spaced apart from the first bond pad, the first and second bond pads collectively provide a single terminal of the semiconductor die, and the first clip includes an end portion extending from the first bond pad to the second bond pad in the first current flow direction, the end portion of the first clip covering and electrically contacting the first and second bond pads.

In an embodiment that can be combined with others, the end portion of the first clip includes a first section that covers and electrically contacts the first bond pad, a second section that is spaced apart from the first section in the first current flow direction, and covers and electrically contacts the second bond pad, and a third section that connects the first and second sections together and extends between the first and second sections in the first current flow direction.

In an embodiment that can be combined with others, a width of the first section is greater than a length of the first bond pad, a width of the second section is less than the width of the first section, and a width of the third section is less than the width of the second bond pad.

In an embodiment that can be combined with others, the first section completely covers the first bond pad, and the second section partially covers the second bond pad in a central portion of the second bond pad such that end portions of the second bond pad are exposed from the first section.

According to another embodiment, the semiconductor device package includes a die pad having a die attach surface, a first lead that is spaced apart and extends away from a first side of the die pad, a second lead that is spaced apart and extends away from a second side of the die pad that is opposite the first side, and a semiconductor die mounted on the die attach surface. The semiconductor die includes a first terminal that is provided by first and second bond pads, and a second terminal that is provided by third and fourth bond pads. The semiconductor device package further includes a first clip that electrically connects the first lead to the first and second bond pads and a second clip that electrically connects the second lead to the third and fourth bond pads. The first, second, third and fourth bond parts are parallel to and spaced apart from one another. The third bond pad is disposed between the first and second bond pads. The second bond pad is disposed between the third and fourth bond pads. The first bond pad is spaced closest to the first side of the die pad. The fourth bond pad is spaced closest to the second side of the die pad.

In an embodiment that can be combined with others, each of the first, second, third and fourth bond pads are elongated with first and second longer edge sides that are opposite one another and extend along a length of the first, second, third and fourth bond pads, respectively.

In an embodiment that can be combined with others, the first longer edge side of the first bond pad faces and is spaced closest to the first side of the die pad than any of the first and second longer edge sides of the second, third and fourth bond pads, and the second longer edge side of the fourth bond pad faces and is spaced closest to the second side of the die pad than any of the firstand second edge longer sides of the first, second and third bond pads.

In an embodiment that can be combined with others, the first longer edge side of the first bond pad is parallel to the first side of the die pad.

In an embodiment that can be combined with others, the second longer edge side of the fourth bond pad is parallel to the second side of the die pad.

In an embodiment that can be combined with others, the first clip includes an end portion that extends over the first, second and third bond pads and electrically connects with the first and second bond pads, and wherein the second clip comprises an end portion that extends over the fourth, third, and second bond pads and electrically connects with the third and fourth bond pads.

In an embodiment that can be combined with others, the end portion of the first clip includes a first section that covers and electrically contacts the first bond pad, a second section that is spaced apart from the first section and covers and electrically contacts the second bond pad, and a third section that connects the first and second sections together, the third section including an elevated bridge that is vertically spaced apart from the third bond pad.

In an embodiment that can be combined with others, the end portion of the second clip includes a fifth section that covers and electrically contacts the fourth bond pad, two sixth sections that are spaced apart from the fifth sections, each of the sixth sections covering and electrically contacting separated portions of the third bond pad, and two seventh sections that connect the fifth and sixth sections together, the third section of the first clip extends through a gap between the two sixth sections, and the second section of the first clip is disposed between the two of the seventh sections.

In an embodiment that can be combined with others, the semiconductor device package further includes an electrically insulating encapsulant material that encapsulates the semiconductor die, the die pad, and the first and second clips, wherein ends of the first and second leads are exposed from the encapsulant material at a lower side of the semiconductor device package, and an outer surface of the die pad that is opposite from the die attach surface is exposed from the encapsulant material at the lower side of the semiconductor device package between the exposed ends of the first and second leads.

In an embodiment that can be combined with others, the semiconductor device package further includes an electrically insulating encapsulant material that encapsulates the semiconductor die, the die pad, and the first and second clips, wherein ends of the first and second clips are exposed from the encapsulant material at a lower side of the semiconductor device package, and an outer surface of the die pad that is opposite from the die attach surface is exposed from the encapsulant material at an upper side of the semiconductor device package that is opposite from the lower side.

In an embodiment that can be combined with others, the semiconductor further includes a third terminal that is provided by a fifth bond pad, and the semiconductor device package further includes a third lead that is spaced apart and extends away from the second side of the die pad, and a third clip that electrically connects the third lead to the fifth bond pad, a width of the first clip, as measured between first and second outer edge sides of the first clip is substantially equal to a collective width of the second and third clips, and the collective width of the second and third clips is measured between a first outer edge side of the second clip that faces away from the third clip and a second outer edge side of the third clip that faces away from the second clip.

A method of packaging a semiconductor device is disclosed. According to an embodiment, the method includes providing a die pad having a die attach surface, providing a first lead that is spaced apart and extends away from a first side of the die pad, providing a semiconductor die having an electrically conductive first bond pad disposed on an upper side of the semiconductor die that is opposite the die attach surface, providing a first clip, mounting the semiconductor die on the die attach surface, and electrically connecting the first bond pad to the first lead using the first clip. The first bond pad is elongated with first and second longer edge sides that are opposite one another and extend along a length of the first bond pad. The semiconductor die is oriented such that the first and second longer edge sides of the first bond pad are non-perpendicular to a first current flow direction of the first clip, the first current flow direction extending between the first bond pad and the first lead.

In an embodiment that can be combined with others, mounting the semiconductor die includes orienting the semiconductor die such that the first and second longer edge sides of the first bond pad are non-perpendicular to the first side of the die pad.

In an embodiment that can be combined with others, mounting the semiconductor die includes orienting the semiconductor die such that the first and second longer edge sides of the first bond pad are parallel to the first side of the die pad.

In an embodiment that can be combined with others, the first clip includes first and second outer edge sides that are opposite one another, electrically connecting the first bond pad to the first lead includes placing the first clip over the die pad such that the first and second outer edge sides intersect with the first side of the die pad, and orienting the first clip such that the first and second longer edge sides of the first bond pad are non-parallel to the first and second outer edge sides of the first clip.

In an embodiment that can be combined with others, the first clip is oriented such that the first and second longer edge sides of the first bond pad are perpendicular to the first and second outer edge sides of the first clip.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity and the components described herein are able to function according to the application requirements, the term "substantially" encompasses any of these deviations.

As used herein, relative angular terminology such as "parallel," and "perpendicular" means that the required relationship is identifiable in the product using known techniques and/or is practically achievable in the process used to make the product. For example, two edge sides are "parallel" to one another if the directional plane that the two edge sides extends along deviates by no more than +/−1 degrees, wherein +/−1 degrees represents the detectable limits of the equipment used to determine the relationship between the two edge sides or the tolerance window of the process used to produce the two edge sides. By contrast, "non-parallel," and "non-perpendicular" refer to intentional deviations from a parallel and perpendicular relationship that is identifiable in the product using known techniques and is practically achievable in the process used to make the product. Of course, +/−1 degrees is used as an example of one detection capability or process window, and the actual values may change depending upon the state of technology.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device package, comprising:
a die pad comprising a die attach surface;
a first lead that is spaced apart and extends away from a first side of the die pad;
a semiconductor die mounted on the die attach surface, the semiconductor die comprising a first bond pad and a second bond pad, each being disposed on an upper side of the semiconductor die that is opposite the die attach surface;
a first clip that electrically connects the first lead to the first bond pad;
wherein the first bond pad is elongated with first and second longer edge sides that are opposite one another and extend along a length of the first bond pad,
wherein the semiconductor die is oriented such that the first and second longer edge sides of the first bond pad are non-parallel to a first current flow direction of the first clip, the first current flow direction extending between the first bond pad and the first lead,
wherein the second bond pad is elongated with first and second longer edge sides that are opposite one another and extend along a length of the second bond pad,
wherein the second bond pad is spaced apart from the first bond pad,
wherein the first and second bond pads collectively provide a single terminal of the semiconductor die, and
wherein the first clip comprises an end portion extending from the first bond pad to the second bond pad in the first current flow direction, the end portion of the first clip covering and electrically contacting the first and second bond pads.

2. The semiconductor device package of claim 1, wherein the first clip comprises first and second outer edge sides that are opposite one another and intersect with the first side of the die pad, and wherein the first current flow direction is parallel to the first and second outer edge sides.

3. The semiconductor device package of claim 1, wherein the first current flow direction is perpendicular to the first side of the die pad.

4. The semiconductor device package of claim 1, wherein the end portion of the first clip comprises:
a first section that covers and electrically contacts the first bond pad;
a second section that is spaced apart from the first section in the first current flow direction, and covers and electrically contacts the second bond pad; and
a third section that connects the first and second sections together and extends between the first and second sections in the first current flow direction.

5. The semiconductor device package of claim 4, wherein a width of the first section is greater than a length of the first bond pad, wherein a width of the second section is less than the width of the first section, and wherein a width of the third section is less than a length of the second bond pad.

6. The semiconductor device package of claim 4, wherein the first section completely covers the first bond pad, and wherein the second section partially covers the second bond pad in a central portion of the second bond pad such that end portions of the second bond pad are exposed from the first section.

7. A semiconductor device package, comprising:
a die pad comprising a die attach surface;
a first lead that is spaced apart and extends away from a first side of the die pad;
a second lead that is spaced apart and extends away from a second side of the die pad that is opposite the first side;
a semiconductor die mounted on the die attach surface, the semiconductor die comprising a first terminal that is provided by first and second bond pads, and a second terminal that is provided by third and fourth bond pads,
a first clip that electrically connects the first lead to the first and second bond pads; and
a second clip that electrically connects the second lead to the third and fourth bond pads,
wherein the first, second, third and fourth bond pads are parallel to and spaced apart from one another,
wherein the third bond pad is disposed between the first and second bond pads,
wherein the second bond pad is disposed between the third and fourth bond pads,
wherein the first bond pad is spaced closest to the first side of the die pad, and
wherein the fourth bond pad is spaced closest to the second side of the die pad.

8. The semiconductor device package of claim 7, wherein each of the first, second, third and fourth bond pads are elongated with first and second longer edge sides that are opposite one another and extend along a length of the first, second, third and fourth bond pads, respectively.

9. The semiconductor device package of claim 8, wherein the first longer edge side of the first bond pad faces and is spaced closer to the first side of the die pad than any of the first and second longer edge sides of the second, third and fourth bond pads, and wherein the second longer edge side of the fourth bond pad faces and is spaced closer to the second side of the die pad than any of the first and second edge longer sides of the first, second and third bond pads.

10. The semiconductor device package of claim 9, wherein the first longer edge side of the first bond pad is parallel to the first side of the die pad.

11. The semiconductor device package of claim 9, wherein the second longer edge side of the fourth bond pad is parallel to the second side of the die pad.

12. The semiconductor device package of claim 9, wherein the end portion of the first clip comprises:
a first section that covers and electrically contacts the first bond pad;
a second section that is spaced apart from the first section and covers and electrically contacts the second bond pad; and
a third section that connects the first and second sections together,
wherein the third section comprises an elevated bridge that is vertically spaced apart from the third bond pad.

13. The semiconductor device package of claim 12, wherein the end portion of the second clip comprises:
   a fifth section that covers and electrically contacts the fourth bond pad;
   two sixth sections that are spaced apart from the fifth sections, each of the sixth sections covering and electrically contacting separated portions of the third bond pad; and
   two seventh sections that connect the fifth and sixth sections together,
   wherein the third section of the first clip extends through a gap between the two sixth sections, and wherein the second section of the first clip is disposed between the two of the seventh sections.

14. The semiconductor device package of claim 7, wherein the first clip comprises an end portion that extends over the first, second and third bond pads and electrically connects with the first and second bond pads, and wherein the second clip comprises an end portion that extends over the fourth, third, and second bond pads and electrically connects with the third and fourth bond pads.

15. The semiconductor device package of claim 7, further comprising an electrically insulating encapsulant material that encapsulates the semiconductor die, the die pad, and the first and second clips, wherein ends of the first and second leads are exposed from the encapsulant material at a lower side of the semiconductor device package, and wherein an outer surface of the die pad that is opposite from the die attach surface is exposed from the encapsulant material at the lower side of the semiconductor device package between the exposed ends of the first and second leads.

16. The semiconductor device package of claim 7, further comprising an electrically insulating encapsulant material that encapsulates the semiconductor die, the die pad, and the first and second clips, wherein ends of the first and second clips are exposed from the encapsulant material at a lower side of the semiconductor device package, and wherein an outer surface of the die pad that is opposite from the die attach surface is exposed from the encapsulant material at an upper side of the semiconductor device package that is opposite from the lower side.

17. The semiconductor device package of claim 7, wherein the semiconductor further comprises a third terminal that is provided by a fifth bond pad, wherein the semiconductor device package further comprises:
   a third lead that is spaced apart and extends away from the second side of the die pad; and
   a third clip that electrically connects the third lead to the fifth bond pad,
   wherein a width of the first clip, as measured between first and second outer edge sides of the first clip is substantially equal to a collective width of the second and third clips,
   wherein the collective width of the second and third clips is measured between a first outer edge side of the second clip that faces away from the third clip and a second outer edge side of the third clip that faces away from the second clip.

18. A method of packaging a semiconductor device, comprising:
   providing a die pad comprising a die attach surface;
   providing a first lead that is spaced apart and extends away from a first side of the die pad;
   providing a semiconductor die comprising an electrically conductive first bond pad and a second bond pad, each being disposed on an upper side of the semiconductor die that is opposite the die attach surface,
   providing a first clip;
   mounting the semiconductor die on the die attach surface;
   electrically connecting the first bond pad to the first lead using the first clip,
   wherein the first bond pad is elongated with first and second longer edge sides that are opposite one another and extend along a length of the first bond pad, and
   wherein the semiconductor die is oriented such that the first and second longer edge sides of the first bond pad are non-perpendicular to a first current flow direction of the first clip, the first current flow direction extending between the first bond pad and the first lead,
   wherein the second bond pad is elongated with first and second longer edge sides that are opposite one another and extend along a length of the second bond pad,
   wherein the second bond pad is spaced apart from the first bond pad,
   wherein the first and second bond pads collectively provide a single terminal of the semiconductor die, and
   wherein the first clip comprises an end portion extending from the first bond pad to the second bond pad in the first current flow direction, the end portion of the first clip covering and electrically contacting the first and second bond pads.

19. The method of claim 18, wherein mounting the semiconductor die comprises orienting the semiconductor die such that the first and second longer edge sides of the first bond pad are non-perpendicular to the first side of the die pad.

20. The method of claim 18, wherein mounting the semiconductor die comprises orienting the semiconductor die such that the first and second longer edge sides of the first bond pad are parallel to the first side of the die pad.

21. The method of claim 18, wherein the first clip comprises first and second outer edge sides that are opposite one another, wherein electrically connecting the first bond pad to the first lead comprises placing the first clip over the die pad such that the first and second outer edge sides intersect with the first side of the die pad, and orienting the first clip such that the first and second longer edge sides of the first bond pad are non-parallel to the first and second outer edge sides of the first clip.

22. The method of claim 21, wherein the first clip is oriented such that the first and second longer edge sides of the first bond pad are perpendicular to the first and second outer edge sides of the first clip.

* * * * *